(12) United States Patent
Kim et al.

(10) Patent No.: US 11,417,637 B2
(45) Date of Patent: Aug. 16, 2022

(54) STACKED DECOUPLING CAPACITORS WITH INTEGRATION IN A SUBSTRATE

(71) Applicant: QUALCOMM Incorporated, San Diego, CA (US)

(72) Inventors: Jonghae Kim, San Diego, CA (US); Milind Shah, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/864,363

(22) Filed: May 1, 2020

(65) Prior Publication Data

US 2021/0343684 A1    Nov. 4, 2021

(51) Int. Cl.
| | |
|---|---|
| H05K 1/18 | (2006.01) |
| H01L 23/498 | (2006.01) |
| H01L 25/16 | (2006.01) |
| H01L 23/00 | (2006.01) |
| H01L 49/02 | (2006.01) |
| H01L 21/48 | (2006.01) |

(52) U.S. Cl.
CPC ......... *H01L 25/16* (2013.01); *H01L 21/4853* (2013.01); *H01L 21/4857* (2013.01); *H01L 23/49816* (2013.01); *H01L 23/49822* (2013.01); *H01L 23/49838* (2013.01); *H01L 24/13* (2013.01); *H01L 24/16* (2013.01); *H01L 24/81* (2013.01); *H01L 28/60* (2013.01); *H05K 1/186* (2013.01); *H01L 24/32* (2013.01); *H01L 24/48* (2013.01); *H01L 24/73* (2013.01); *H01L 2224/13147* (2013.01); *H01L 2224/16227* (2013.01); *H01L 2224/32145* (2013.01); *H01L 2224/48091* (2013.01); *H01L 2224/48106* (2013.01); *H01L 2224/48227* (2013.01); *H01L 2224/73215* (2013.01); *H01L 2224/73265* (2013.01); *H01L 2924/1436* (2013.01); *H01L 2924/19041* (2013.01); *H01L 2924/19102* (2013.01); *H05K 2201/10015* (2013.01); *H05K 2201/10545* (2013.01)

(58) Field of Classification Search
CPC ... H01L 2924/19102; H01L 2924/1436; H01L 2924/19041; H01L 2224/16227
See application file for complete search history.

(56) References Cited

U.S. PATENT DOCUMENTS

| | | | | |
|---|---|---|---|---|
| 4,356,529 A | * | 10/1982 | Kopel | H01G 4/232 361/309 |
| 6,876,554 B1 | * | 4/2005 | Inagaki | H01L 23/642 257/E23.079 |
| 2014/0145299 A1 | * | 5/2014 | Kalnitsky | H01L 28/91 257/532 |
| 2015/0357270 A1 | * | 12/2015 | Yap | H01L 25/16 257/668 |
| 2019/0013301 A1 | * | 1/2019 | Cheah | H01L 23/49838 |

* cited by examiner

*Primary Examiner* — Dale E Page
*Assistant Examiner* — Wilner Jean Baptiste
(74) *Attorney, Agent, or Firm* — Patterson + Sheridan LLP (57) ABSTRACT

Certain aspects of the present disclosure generally relate to an integrated circuit package having a land-side capacitor electrically coupled to an embedded capacitor. One example integrated circuit package generally includes a package substrate having a first capacitor embedded therein, a semiconductor die disposed above the package substrate, and a second capacitor disposed below the package substrate and electrically coupled to the first capacitor.

20 Claims, 4 Drawing Sheets

STACKED DECOUPLING CAPACITORS WITH INTEGRATION IN A SUBSTRATE

BACKGROUND

Field of the Disclosure

Certain aspects of the present disclosure generally relate to electronic devices and, more particularly, to an integrated circuit package having a land-side capacitor coupled to a capacitor embedded in a package substrate.

Description of Related Art

A continued emphasis in semiconductor technology is to create improved performance semiconductor devices at competitive prices. This emphasis over the years has resulted in extreme miniaturization of semiconductor devices, made possible by continued advances in semiconductor processes and materials in combination with new and sophisticated device designs. Large numbers of transistors are employed in integrated circuits (ICs) in many electronic devices. For example, components such as central processing units (CPUs), graphics processing units (GPUs), and memory systems each employ a large quantity of transistors for logic circuits and memory devices.

In some cases, an IC is powered by a voltage regulator that converts available wall voltages to the lower voltages used by the IC. The voltage regulator ensures a predictable power supply is provided to the IC. As transistors functioning as switches in the IC turn on and off, the power load changes rapidly, placing additional demand on the voltage regulator. The distance between the voltage regulator and the IC creates a long response time, preventing the voltage regulator from increasing power to the IC instantaneously, especially when the transistors switch on and off millions or billions of times each second. Decoupling capacitors provide additional stability to the power supplied to the IC. For instance, decoupling capacitors may reduce IC electrical impedance to ground for high-frequency transients and enable the IC to maintain a near-constant voltage across all operating frequencies.

Decoupling capacitors located in close proximity to the IC provide a local charge reservoir for the IC. As demand on the power supply changes rapidly, the capacitor provides a localized supply of power and can recharge at a later time when the power demand decreases. However, as transistor sizes have decreased and transistor densities have increased, finding area on the IC for decoupling capacitors has become increasingly challenging. In certain cases, capacitors (e.g., metal-oxide-semiconductor (MOS) capacitors) are built from thick oxide transistors commonly used for input/output (I/O) transistors. These capacitors are fabricated on the substrate to provide decoupling capacitance for the circuitry on the substrate. Thick oxide transistors offer very small values of capacitance in comparison to the large amounts of substrate area these transistors consume that could otherwise be used for other circuitry. In some cases, the capacitors (e.g., deep trench capacitors) are formed from an array of deep trenches in a substrate and filled with an electrical insulator (e.g., a dielectric) between layers of electrodes. In other cases, the capacitors are attached on the land side under the IC die shadow (land-side capacitor: LSC) or adjacent to the die on the die side (die-side capacitor: DSC).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include desirable electrical performance of an integrated circuit package having a land-side capacitor electrically coupled to an embedded capacitor serving as decoupling capacitors.

Certain aspects of the present disclosure provide an integrated circuit package. The integrated circuit package generally includes a package substrate having a first capacitor embedded therein, a semiconductor die disposed above the package substrate, and a second capacitor disposed below the package substrate and electrically coupled to the first capacitor.

Certain aspects of the present disclosure provide an electronic device that generally includes an integrated circuit package as described herein. In this case, the first and second capacitors may be electrically coupled to a power distribution network of the electronic device.

Certain aspects of the present disclosure provide a method for fabricating an integrated circuit package. The method generally includes forming a package substrate having a first capacitor embedded therein, disposing a semiconductor die above the package substrate, and disposing a second capacitor below the package substrate such that the second capacitor is electrically coupled to the first capacitor.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to an integrated circuit package having a land-side capacitor coupled to a capacitor embedded in the package substrate of the integrated circuit package.

In the micro-electronic technology industry, there is a continuous demand and evolution of processes, technologies, and assembly methodologies to design and implement smaller, more efficient integrated circuit (IC) packages (also referred to as a "chip package"). A power distribution network (PDN) is used to deliver power from a power supply/source to the integrated circuit(s) in a chip package. The PDN inherently suffers from noise and/or resonance, which interfere with the integrated circuits that the PDN is meant to power. For instance, excessive voltage drops in the power grid may reduce switching speeds and noise margins of semiconductor devices in the integrated circuit packages, which may lead to functional failures of the semiconductor devices. In certain cases, an IC package may encounter a parasitic loop inductance through the package substrate of the IC package. As the parasitic loop inductance increases, the output impedance at the semiconductor die of the IC package at certain low frequencies may also increase. That is, the output impedance at the semiconductor die may be proportional to the parasitic loop inductance. As the parasitic loop inductance increases, the delay of the transient response at the semiconductor die may also increase. That is, the delay of the transient response at the semiconductor die may be proportional to the loop inductance.

Certain aspects of the present disclosure generally relate to an IC package having a land-side capacitor electrically coupled to a capacitor embedded in the package substrate of the integrated circuit package. The arrangement of land-side and embedded capacitors may serve as decoupling capacitors in a power distribution network of the IC package as further described herein. In certain aspects, the land-side and embedded capacitors described herein may facilitate a desirable loop inductance that reduces the output impedance and provides a desirable transient response. That is, the land-side and embedded capacitors described herein may provide desirable electrical performance for the IC package, such as elimination of the loop inductance or at least an acceptably lowered level of loop inductance.

Figure 1:
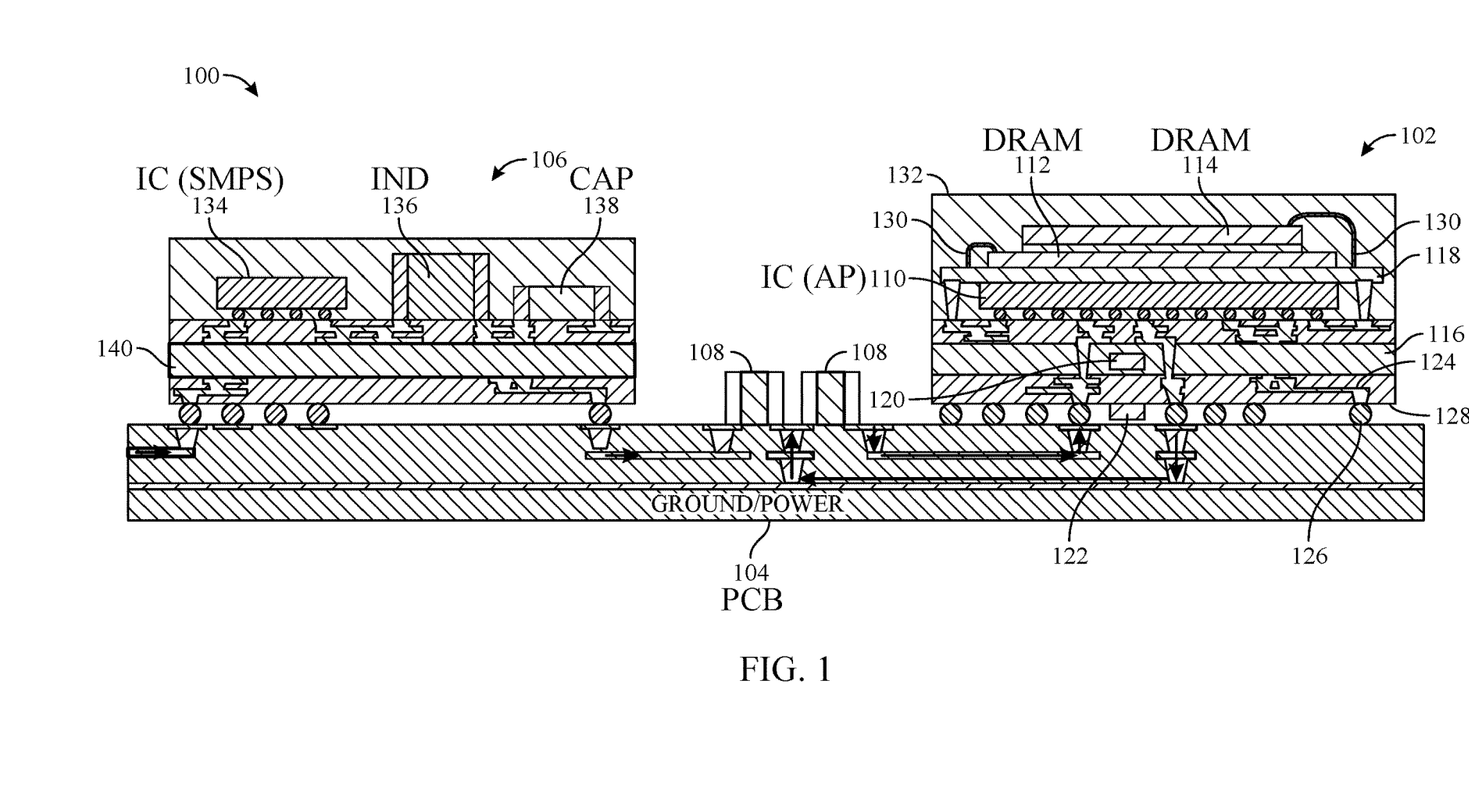
FIG. 1 illustrates a cross-sectional view of an example electronic device with a power distribution network, in accordance with certain aspects of the present disclosure.

In certain aspects, an electronic device may have an IC package (e.g., a system-on-chip (SOC)) with a land-side capacitor coupled to a capacitor embedded in the package substrate of the integrated circuit package as further described herein. FIG. 1 illustrates a cross-sectional view of an example electronic device 100 having an IC package with the land-side and embedded capacitors, in accordance with certain aspects of the present disclosure. As shown, the electronic device 100 may include a chip assembly 102, a circuit board 104, and a power supply circuit 106. In certain cases, the electronic device 100 may include additional decoupling capacitors 108. The electronic device 100 may be a computing device such as a portable computing device (e.g., a tablet) or wireless communication device (e.g., a mobile phone or smartphone) with a transceiver.

The chip assembly 102 may be coupled to the circuit board 104. The chip assembly 102 may include a first semiconductor die 110 (also referred to herein as the "first die"), one or more second semiconductor die(s) 112, 114 (also referred to herein as the "second dies"), a package substrate 116, an interposer 118, one or more first capacitors 120, and one or more second capacitors 122. The chip assembly 102 may be, for example, an IC package such as a fan-out wafer-level package-on-package (PoP) assembly.

The first die 110 may be, for example, a processor such as the processor of a system-on-a-chip (SoC). In aspects, the first die 110 may include a processor, a graphics processing unit (GPU), a digital signal processor (DSP), an application specific integrated circuit (ASIC), a field programmable gate array (FPGA) or other programmable logic device (PLD), discrete gate or transistor logic, or any combination thereof. The first die 110 is disposed between the package substrate 116 and the interposer 118.

The package substrate 116 may include one or more redistribution layers that provide access to the input/output (I/O) of the first die 110 and second dies 112, 114. The package substrate 116 may include electrical routing 124, such as conductive traces and vias, embedded in the package substrate 116. Solder balls 126 may be disposed below the package substrate 116 and electrically coupled to the I/O pins of the first die 110 through the electrical routing 124 of the package substrate 116. The solder balls 126 may enable the chip assembly 102 to be mounted and electrically coupled to external circuitry, such as the circuit board 104, a motherboard, another chip, or a wafer. The solder balls 126 may form a ball grid array (BGA) with the second capacitor 122 disposed adjacent to a portion of the solder balls 126.

Figure 2:
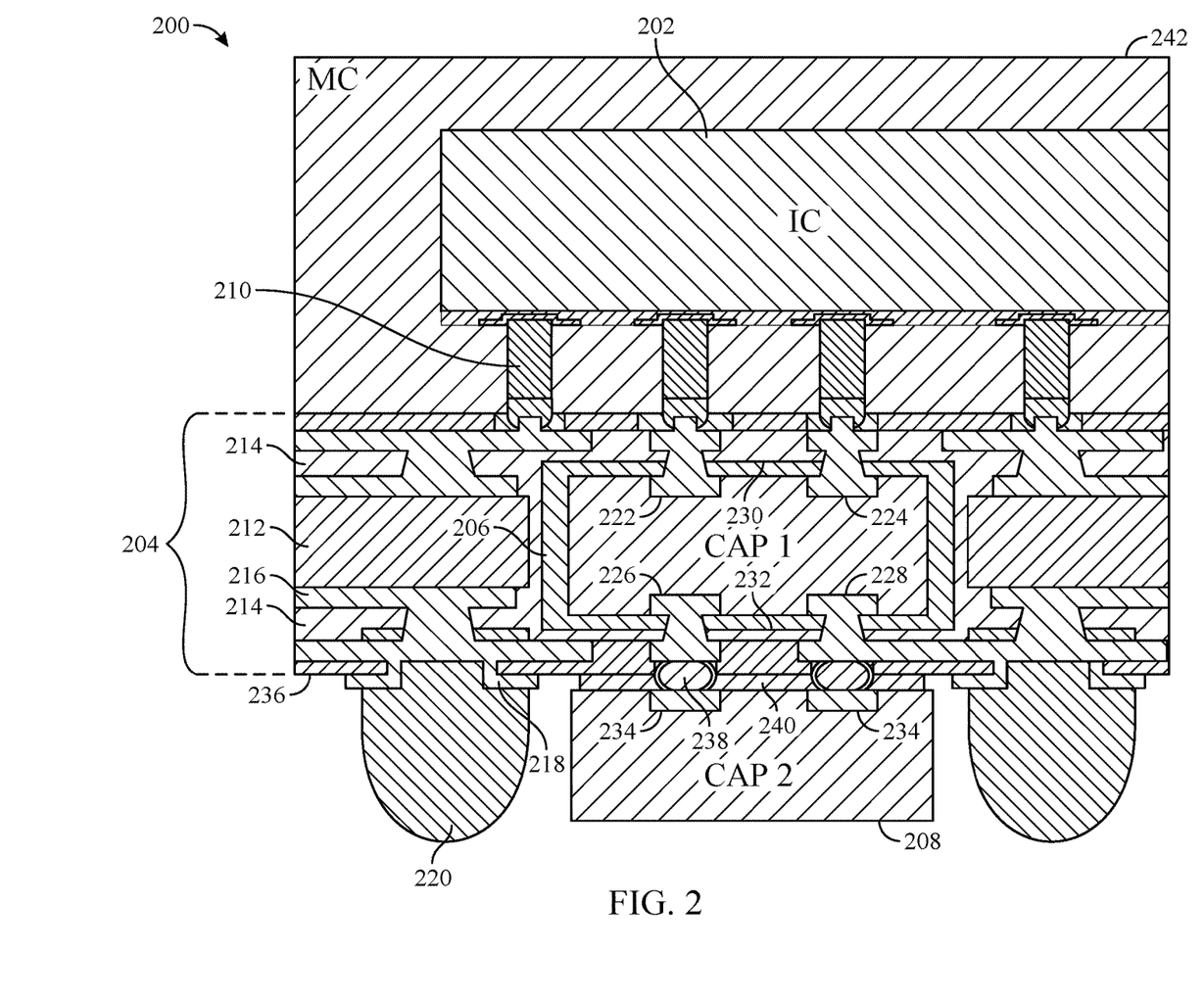
FIG. 2 illustrates a cross-sectional view of a segment of an example integrated circuit (IC) package, in accordance with certain aspects of the present disclosure.

In certain aspects, as illustrated in FIG. 1, the first capacitor 120 may be embedded in the package substrate 116, as further described herein with respect to FIG. 2. The second capacitor 122 may be coupled to a land-side surface 128 of the package substrate 116. In other words, the second capacitor 122 is disposed on a land side of an IC package (e.g., the chip assembly 102) between electrical contacts (e.g., the solder balls 126) extending from a surface (the land-side surface 128) of the IC package. The land-side surface 128 is opposite from the die-side surface of the package substrate, where the first die 110 is disposed above the die-side surface. In certain aspects, the first and second capacitors 120, 122 may be electrically coupled together and may serve as decoupling capacitors for the circuitry of the first die 110 and/or second dies 112, 114, as further described herein with respect to FIG. 2. In aspects, the first and second capacitors are electrically coupled to a power distribution network (e.g., the power supply circuit 106 and power rails through the circuit board 104) of the electronic device 100.

The interposer 118 is disposed between the first die 110 and the second dies 112, 114. The interposer 118 includes electrical routing (not shown) that provides access to the I/O pins of the second dies 112, 114. For example, the first die 110 may be electrically coupled to the second dies 112, 114 through the interposer 118.

The second dies 112, 114 are disposed above the interposer 118. In certain cases, the second dies 112, 114 include memory chips (e.g., dynamic random access memory (DRAM) chips) that are electrically coupled to the first die 110 (e.g., via the interposer 118). In aspects, conductive wiring 130 (e.g., wire bonding) may be electrically coupled between the second dies 112, 114 and the interposer 118. The conductive wiring 130 may provide access to the frontside of the second dies 112, 114.

In certain aspects, an encapsulation material 132 may be disposed above the package substrate 116 and surround the first die 110, the interposer 118, and the second dies 112, 114. The encapsulation material 132 may be a molding compound such as an epoxy resin. In aspects, the encapsulation material 132 may serve as structural support that encapsulates the first die 110, the interposer 118, and the second dies 112, 114. In aspects, the encapsulation material 132 may also prevent or at least reduce physical damage and corrosion of the electrical components of the chip assembly 102.

The circuit board 104 may be a printed circuit board, motherboard, or any suitable carrier for electrical circuits such as the chip assembly 102 and power supply circuit 106.

In aspects, the power supply circuit 106 may be a switched-mode power supply circuit that provides a variable supply voltage to the chip assembly 102 through the circuit board 104. That is, electrical power may be delivered to the chip assembly 102 through circuit board 104 from the power supply circuit 106. The power distribution network of the electronic device 100 may include the power supply path to the chip assembly 102 through the circuit board 104 from the power supply circuit 106, and in certain cases, the additional capacitors 108 coupled to the circuit board 104 may act as decoupling capacitors for this power supply path. The power supply circuit 106 may be an IC package electrically coupled to the circuit board 104. The power supply circuit 106 includes a third semiconductor die 134, an inductor 136, and a third capacitor 138. In aspects, the third die 134 may include a switched-mode power supply (SMPS) circuit and/or a power management integrated circuit (PMIC). The third die 134 may be electrically coupled to the inductor 136 and third capacitor 138 through a package substrate 140. The inductor 136 may be electrically coupled in series between the third die 134 and the third capacitor 138. The inductor 136 and third capacitor 138 may be configured as an LC resonant circuit having a passband (or resonant frequency range) within a certain frequency range of the variable supply voltage of the power supply circuit 106.

Example Integrated Circuit Package

FIG. 2 illustrates a cross-sectional view of a segment of an example IC package (e.g., the chip assembly 102) having a land-side capacitor coupled to an embedded capacitor, in accordance with certain aspects of the present disclosure. As shown, the IC package 200 includes a semiconductor die 202, a package substrate 204, a first capacitor 206, and a second capacitor 208.

The semiconductor die 202 may be, for example, a SoC having various electrical components, such as a central processing unit, graphics processing unit, digital signal processor, logic circuits, memory devices, and/or a modem. The semiconductor die 202 may be disposed above the package substrate 204. In aspects, the semiconductor die 202 may include a plurality of conductive pillars 210, and the semiconductor die 202 is coupled to the package substrate 204 via the conductive pillars 210. The conductive pillars 210 may comprise copper (Cu), for example, and be referred to as "Cu pillars." The conductive pillars 210 may be electrically coupled to I/O interfaces of the various electrical circuits implemented in the semiconductor die 202. The conductive pillars 210 may provide a desirable contact height (e.g., shorter height) compared to solder balls, and the contact height of the conductive pillars 210 may facilitate elimination of the parasitic loop inductance, or at least a permissible level of loop inductance.

The package substrate 204 may include one or more redistribution layers that provide access to the I/O interfaces of the semiconductor die 202. In aspects, the package substrate 204 may have a core substrate material 212 (such as copper clad laminate, dielectric material, or metal substrate) with one or more dielectric layers 214 disposed above and/or below the core substrate material 212. In aspects, the dielectric layers 214 may be layers of fiberglass impregnated with resin (i.e., prepreg). In certain cases, the package substrate 204 may be a wiring substrate without a core substrate material. That is, the package substrate 204 may be a coreless embedded trace substrate with one or more dielectric layers (e.g., prepreg) and electrical routing disposed between the dielectric layers.

The package substrate 204 may include electrical routing 216 (e.g., conductive traces and vias) and conductive pads 218 (e.g., under bump metallization). Solder balls 220 may be disposed below the package substrate 116 and coupled to conductive pads 218. In aspects, the solder balls 220 may be electrically coupled to a portion of the conductive pillars 210 of the semiconductor die 202 through the electrical routing 216 of the package substrate 204. The solder balls 220 may enable the IC package 200 to be mounted and electrically coupled to external circuitry, such as a circuit board (e.g., the circuit board 104), a motherboard, another chip, or a wafer. The solder balls 220 may form a solder ball grid array with the second capacitor 208 disposed adjacent to a portion of the solder balls 220 (e.g., between certain solder balls).

The first capacitor 206 is embedded in the package substrate 204 (i.e., an embedded passive substrate), and in certain cases, the first capacitor 206 may intersect at least a portion of the core substrate material 212. The first capacitor 206 may include an array of trench capacitors, a metal-insulator-metal (MIM) capacitor, a metal-oxide-metal (MOM) capacitor, a metal-oxide-semiconductor (MOS) capacitor, a metal fringe capacitor, a junction capacitance of a diode or transistor, or the like. In certain aspects, the first capacitor 206 may be an integrated passive device (IPD) of trench capacitors, which may provide a slim profile to be embedded in the package substrate. In aspects, the first capacitor 206 is electrically coupled to a portion of the conductive pillars 210 of the semiconductor die 202.

For example, the first capacitor 206 may have a first set of terminals 222 and a second set of terminals 224 electrically coupled to the semiconductor die 202, for example, through a portion of the conductive pillars 210. The first set of terminals 222 may be electrically coupled in parallel with each other, and the second set of terminals 224 may be electrically coupled in parallel with each other. In certain aspects, the multiple parallel paths available for the terminals 222, 224 may eliminate the loop inductance or provide an acceptable level of loop inductance.

In certain cases, the first capacitor 206 may also include a third set of terminals 226 and a fourth set of terminals 228 electrically coupled to the second capacitor 208 through the package substrate 204. In aspects, the third and fourth set of terminals 226, 228 may be disposed on an opposite side of the first capacitor 206 from the first and second set of terminals 222, 224. That is, the first capacitor 206 may include a first plurality of terminals (e.g., the first set of terminals 222 and second set of terminals 224) disposed on a first surface 230 of the first capacitor 206 and electrically coupled to the semiconductor die 202, and a second plurality of terminals (e.g., the third set of terminals 226 and fourth set of terminals 228) disposed on a second surface 232 of the first capacitor 206 and electrically coupled to a plurality of terminals 234 of the second capacitor 208. The second surface 232 of the first capacitor 206 is opposite from the first surface 230 of the first capacitor 206. In aspects, the third set of terminals 226 may be electrically coupled in parallel with each other, and the fourth set of terminals 228 may be electrically coupled in parallel with each other. In certain aspects, the multiple parallel paths available for the terminals 226, 228 may eliminate the loop inductance or provide a permissible level of loop inductance.

The second capacitor 208 is disposed below the package substrate 204 and electrically coupled to the first capacitor 206. In certain cases, the second capacitor 208 is disposed directly under the first capacitor 206 to facilitate an efficient electrical path (e.g., with the smallest inductance) to the first capacitor 206 through the package substrate 204. In aspects, the second capacitor 208 is coupled to a land-side surface 236 of the package substrate 204. For example, the terminals 234 of the second capacitor 208 may be electrically coupled to the package substrate 204 through solder bumps 238. In aspects, an underfill material 240 may also be disposed between the second capacitor 208 and package substrate 204. The underfill material 240 may be an adhesive epoxy resin, which provides structural support between the second capacitor 208 and package substrate 204. In certain cases, the underfill material 240 may include silica to provide a coefficient of thermal expansion similar to the solder bumps 238. The second capacitor 208 may include an array of trench capacitors, a MIM capacitor, a MOM capacitor, a MOS capacitor, a metal fringe capacitor, a junction capacitance of a diode or transistor, or the like. The first capacitor 206 and the second capacitor 208 may be the same type or different types of capacitors.

In aspects, the first and second capacitors 206, 208 may be electrically coupled in parallel with each other to provide a greater equivalent capacitance. In aspects, the first and second capacitors 206, 208 may serve as a decoupling capacitor for the power distribution network of the IC package 200. For example, the first and second capacitors 206, 208 may be electrically coupled to one or more power rails of the semiconductor die 202, for example, through the conductive pillars 210. Additionally or alternatively, the first and second capacitors may be electrically coupled to a reference potential node (e.g., a ground node) of the IC package 200, for example, through the package substrate 204 and/or conductive pillars 210.

In certain cases, the IC package 200 may also include an encapsulation material 242 (e.g., the encapsulation material 132 of FIG. 1). The encapsulation material 242 may be disposed above the package substrate 204 and surround the semiconductor die 202. The encapsulation material 242 may be a molding compound such as an epoxy resin.

Figure 3:
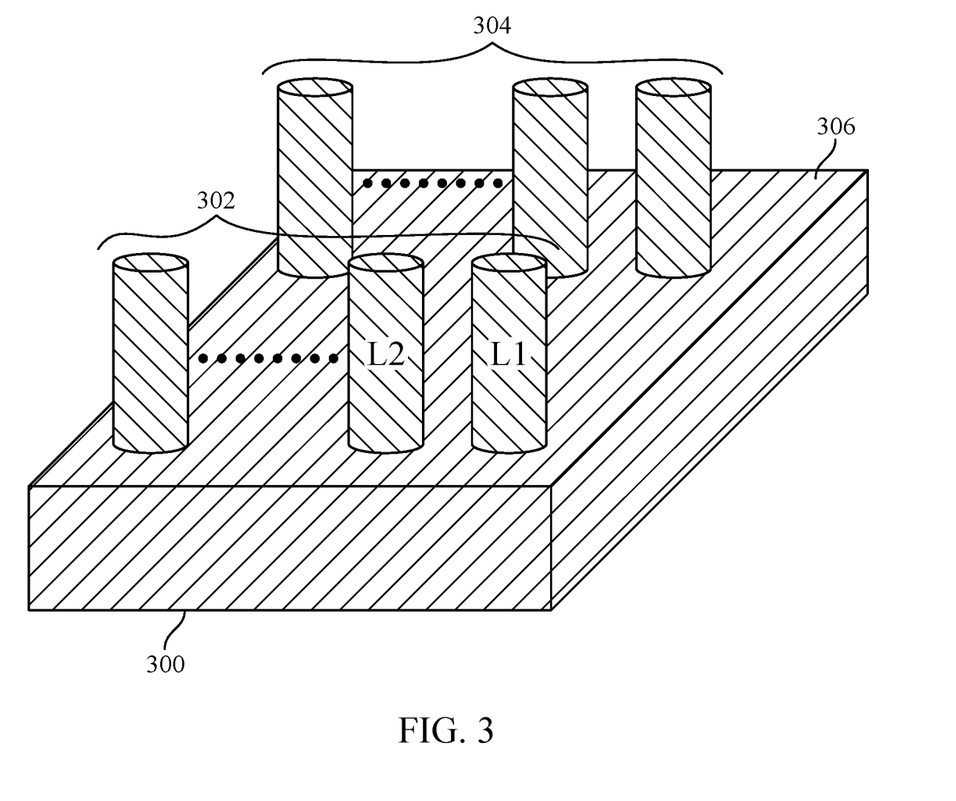
FIG. 3 illustrates an isometric view of an example capacitor, in accordance with certain aspects of the present disclosure.

FIG. 3 illustrates an isometric view of an example capacitor 300 with a plurality of terminals, in accordance with certain aspects of the present disclosure. The capacitor 300 may be the first capacitor 206 and/or the second capacitor 208 depicted in FIG. 2. As shown, the capacitor 300 includes a first set of terminals 302 and a second set of terminals 304. In aspects, the first set of terminals 302 and second set of terminals 304 may be disposed on a surface 306 of the capacitor 300. The first set of terminals 302 and second set of terminals 304 may be arranged in separate rows on the surface 306. While the example depicted in FIG. 3 is described herein with respect to terminals disposed on a single surface of the capacitor to facilitate understanding, aspects of the present disclosure may also include terminals disposed on opposite surfaces, for example, as described herein with respect to FIG. 2. That is, there may be four sets of terminals, two sets on the top surface and two sets on the lower surface, as illustrated for the first capacitor 206 of FIG. 2.

It should be appreciated that the land-side capacitor and embedded capacitor along with the conductive pillars of the semiconductor die may provide desirable electrical performance of the semiconductor die such as a relatively low loop inductance encountered at the semiconductor die. That is, with the land-side capacitor electrically coupled to and positioned directly below the embedded capacitor, and with the embedded capacitor electrically coupled to and positioned directly below the short conductive pillars of the semiconductor die, the decoupling capacitor arrangement may eliminate, or at least reduce, the loop inductance at the semiconductor die on the power distribution network.

Example Fabrication Method

Figure 4:
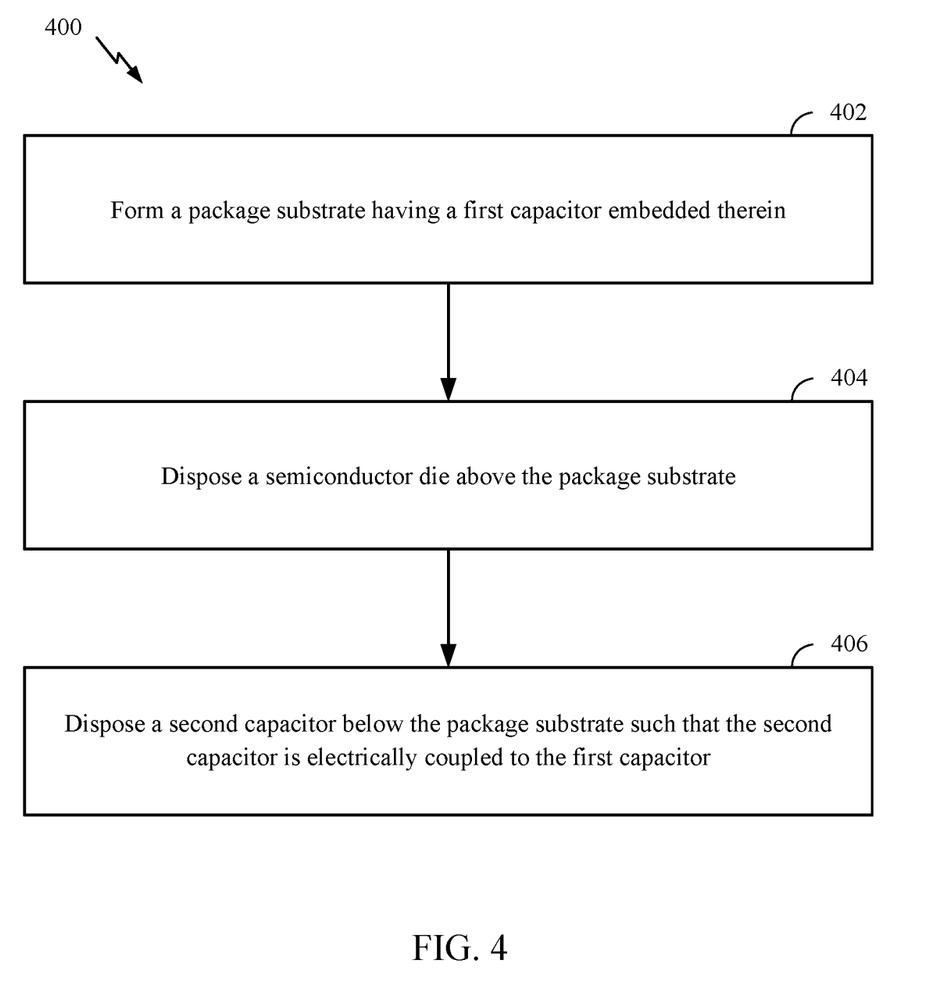
FIG. 4 is a flow diagram of example operations for fabricating an IC package, in accordance with certain aspects of the present disclosure.

FIG. 4 is a flow diagram of example operations 400 for fabricating an integrated circuit package (e.g., the integrated circuit package 200 depicted in FIG. 2), in accordance with certain aspects of the present disclosure. The operations 400 may be performed by an integrated circuit fabrication facility, for example.

The operations 400 begin, at block 402, by forming a package substrate (e.g., the package substrate 204) having a first capacitor (e.g., the first capacitor 206) embedded therein. At block 404, a semiconductor die (e.g., the semiconductor die 202) may be disposed above the package substrate. At block 406, a second capacitor (e.g., the second capacitor 208) may be disposed below the package substrate such that the second capacitor is electrically coupled to the first capacitor.

In certain cases, the semiconductor die may have conductive pillars, for example, as described herein with respect to FIG. 2. With respect to the operations 400, disposing the semiconductor die above the package substrate at block 404 may include coupling the semiconductor die to the package substrate via a plurality of conductive pillars (e.g., the conductive pillars 210). In aspects, a thermocompression bonding process may be performed to couple the conductive pillars of the semiconductor die to the package substrate. In aspects, the first capacitor may be electrically coupled to a portion of the conductive pillars.

In aspects, the first capacitor may be coupled to the semiconductor die through multiple terminals, for example, as described herein with respect to FIGS. 2 and 3. For example, forming the package substrate at block 402 may include forming a first set of terminals (e.g., the first set of terminals 222) and a second set of terminals (e.g., the second set of terminals) on a first surface (e.g., the first surface 230) of the first capacitor. Disposing the semiconductor die above the package substrate at block 404 may include coupling the semiconductor die to the first set of terminals and the second set of terminals of the first capacitor.

In aspects, forming the package substrate at block 402 may include forming a third set of terminals (e.g., the third set of terminals 226) and a fourth set of terminals (e.g., the fourth set of terminals 228) on a second surface (e.g., the second surface 232) of the first capacitor. Disposing the second capacitor below the package substrate at block 406 may include coupling the second capacitor to the third set of terminals and the fourth set of terminals of the first capacitor.

In other words, forming the package substrate at block 402 may include forming a first plurality of terminals on the first surface of the first capacitor and a second plurality of terminals on the second surface of the first capacitor, where the second surface is opposite from the first surface. Disposing the semiconductor die above the package substrate at block 404 may include coupling the semiconductor die to the first plurality of terminals such that the first capacitor is electrically coupled to the semiconductor die through the first plurality of terminals. Disposing the second capacitor below the package substrate at block 406 may include coupling the second capacitor to the second plurality of terminals such that the second capacitor is electrically coupled to the first capacitor through the second plurality of terminals.

In aspects, the package substrate may be formed from a core substrate material, for example, as described herein with respect to FIG. 2. Forming the package substrate at block 402 may include forming electrical routing (e.g., the electrical routing 216) and dielectric layers (e.g., the dielectric layers 214) on a core substrate material (e.g., the core substrate material 212). In certain cases, forming the package substrate at block 402 may further include forming a cavity in the core substrate material and disposing the first capacitor in the cavity of the core substrate material, such that the first capacitor intersect at least a portion of the core substrate material.

In aspects, the package substrate may be formed without a core substrate material. For example, forming the package substrate at block 402 may include forming a coreless embedded trace substrate as the package substrate.

In aspects, the second capacitor may be coupled to a land-side surface of the package substrate, for example, as described herein with respect to FIG. 2. For example, disposing the second capacitor below the package substrate at block 406 may include coupling the second capacitor to the package substrate through solder balls (e.g., the additional solder balls 238), such that the second capacitor is electrically coupled in parallel with the first capacitor. In certain cases, disposing the second capacitor below the package substrate at block 406 may include disposing the second capacitor directly under the first capacitor. An underfill material (e.g., the underfill material 240) may also be applied between the second capacitor and the package substrate.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An integrated circuit package comprising:
   a package substrate having a first capacitor embedded therein;
   a semiconductor die disposed above the package substrate, wherein the semiconductor die is coupled to the package substrate via a plurality of conductive pillars; and
   a second capacitor disposed below the package substrate and electrically coupled to the first capacitor, wherein the first capacitor comprises:
      a first plurality of terminals disposed on a first surface of the first capacitor and electrically coupled to the semiconductor die; and
      a second plurality of terminals disposed on a second surface of the first capacitor and electrically coupled to a plurality of terminals of the second capacitor, the second surface being opposite from the first surface.

2. An integrated circuit package comprising:
a package substrate having a first capacitor embedded therein, wherein the package substrate includes a core substrate material;
a semiconductor die disposed above the package substrate, wherein the semiconductor die is coupled to the package substrate via a plurality of conductive pillars; and
a second capacitor disposed below the package substrate and electrically coupled to the first capacitor.

3. The integrated circuit package of claim 2, wherein the first capacitor comprises a first set of terminals and a second set of terminals electrically coupled to the semiconductor die.

4. The integrated circuit package of claim 3, wherein the first capacitor comprises a third set of terminals and a fourth set of terminals electrically coupled to the second capacitor.

5. The integrated circuit package of claim 2, wherein the first capacitor intersects at least a portion of the core substrate material.

6. An integrated circuit package comprising:
a package substrate having a first capacitor embedded therein;
a semiconductor die disposed above the package substrate; and
a second capacitor disposed below the package substrate and electrically coupled to the first capacitor, wherein:
the first capacitor comprises a first set of terminals and a second set of terminals electrically coupled to the semiconductor die; and
the first capacitor comprises a third set of terminals electrically coupled to the second capacitor.

7. The integrated circuit package of claim 6, wherein the semiconductor die is coupled to the package substrate via a plurality of conductive pillars.

8. The integrated circuit package of claim 7, wherein the conductive pillars comprise copper.

9. The integrated circuit package of claim 7, wherein the first capacitor is electrically coupled to a portion of the conductive pillars.

10. The integrated circuit package of claim 6, wherein the first capacitor includes an array of trench capacitors.

11. The integrated circuit package of claim 6, wherein the first set of terminals is electrically coupled in parallel with each other, and wherein the second set of terminals is electrically coupled in parallel with each other.

12. The integrated circuit package of claim 6, wherein the package substrate is a coreless embedded trace substrate.

13. The integrated circuit package of claim 6, wherein the first capacitor and the second capacitor are electrically coupled to one or more power rails of the semiconductor die.

14. The integrated circuit package of claim 6, wherein the first capacitor and the second capacitor are electrically coupled to a reference potential node of the integrated circuit package.

15. The integrated circuit package of claim 6, wherein the second capacitor is electrically coupled in parallel with the first capacitor.

16. The integrated circuit package of claim 6, wherein the second capacitor is disposed directly under the first capacitor.

17. An electronic device comprising the integrated circuit package of claim 6, wherein the first and second capacitors are electrically coupled to a power distribution network of the electronic device.

18. The integrated circuit package of claim 6, wherein the semiconductor die is coupled to the package substrate via a plurality of conductive pillars.

19. The integrated circuit package of claim 6, wherein the first capacitor further comprises a fourth set of terminals electrically coupled to the second capacitor.

20. The integrated circuit package of claim 19, wherein:
the first set of terminals and the second set of terminals are disposed on a first surface of the first capacitor and electrically coupled to the semiconductor die; and
the third set of terminals and the fourth set of terminals are disposed on a second surface of the first capacitor and electrically coupled to a plurality of terminals of the second capacitor, the second surface of the first capacitor being opposite from the first surface of the first capacitor.

* * * * *